US00RE46797E

(19) United States
(12) Reissued Patent
Hamilton et al.

(10) Patent Number: US RE46,797 E
(45) Date of Reissued Patent: Apr. 17, 2018

(54) CHEMICALLY BONDED CERAMIC RADIATION SHIELDING MATERIAL AND METHOD OF PREPARATION

(71) Applicant: Co-Operations, Inc., Seattle, WA (US)

(72) Inventors: Judd Hamilton, Seattle, WA (US); Vernon D. Hamilton, Tucson, AZ (US)

(73) Assignee: Co-Operations, Inc., Seattle, WA (US)

(21) Appl. No.: 14/712,853

(22) Filed: May 14, 2015

Related U.S. Patent Documents

Reissue of:
(64) Patent No.: 8,440,108
Issued: May 14, 2013
Appl. No.: 12/133,209
Filed: Jun. 4, 2008

U.S. Applications:
(63) Continuation-in-part of application No. PCT/US2006/046722, filed on Dec. 6, 2006, which is a continuation of application No. 11/441,833, filed on May 26, 2006, now abandoned, which is a continuation-in-part of application No. 11/295,708, filed on Dec. 6, 2005, now abandoned.

(51) Int. Cl.

| | |
|---|---|
| ***C04B 35/66*** | (2006.01) |
| ***C01B 21/00*** | (2006.01) |
| ***C09K 3/00*** | (2006.01) |
| ***B01D 53/56*** | (2006.01) |
| ***B01D 53/86*** | (2006.01) |
| ***B01J 8/00*** | (2006.01) |
| ***C01B 25/00*** | (2006.01) |
| ***C01B 33/36*** | (2006.01) |
| ***C01B 39/00*** | (2006.01) |
| ***C01F 7/00*** | (2006.01) |
| ***C04B 14/00*** | (2006.01) |
| ***C04B 35/00*** | (2006.01) |
| ***C04B 33/00*** | (2006.01) |
| ***G21F 1/06*** | (2006.01) |
| ***C04B 35/195*** | (2006.01) |
| ***C04B 28/34*** | (2006.01) |
| ***H05K 9/00*** | (2006.01) |
| ***C04B 35/63*** | (2006.01) |
| ***C04B 35/19*** | (2006.01) |
| ***C04B 35/447*** | (2006.01) |
| *C04B 111/00* | (2006.01) |

(52) U.S. Cl.
CPC ..... *G21F 1/06* (2013.01); *C04B 28/342* (2013.01); *C04B 35/19* (2013.01); *C04B 35/195* (2013.01); *C04B 35/447* (2013.01); *C04B 35/6306* (2013.01); *C04B 35/6309* (2013.01); *C04B 35/6313* (2013.01); *H05K 9/0081* (2013.01); *C04B 2111/00258* (2013.01); *C04B 2235/32* (2013.01); *C04B 2235/3206* (2013.01); *C04B 2235/3212* (2013.01); *C04B 2235/3215* (2013.01); *C04B 2235/3217* (2013.01); *C04B 2235/3229* (2013.01); *C04B 2235/3272* (2013.01); *C04B 2235/3298* (2013.01); *C04B 2235/3472* (2013.01); *C04B 2235/3481* (2013.01); *C04B 2235/5436* (2013.01)

(58) Field of Classification Search
CPC ..... G21F 1/06; C04B 28/342; C04B 35/19; C04B 35/195; C04B 35/447; C04B 35/6309; C04B 35/6313; C04B 35/6306; C04B 2111/00258; C04B 2235/3298; C04B 2235/3206; C04B 2235/3217; C04B 2235/3229; C04B 2235/3272; C04B 2235/3215; C04B 2235/3472; C04B 2235/3481; C04B 2235/5436; C04B 2235/32; C04B 2235/3212; H05K 9/0081
See application file for complete search history.

(56) References Cited

U.S. PATENT DOCUMENTS

| | | | | |
|---|---|---|---|---|
| 1,576,730 | A | 3/1926 | Harth | |
| 2,992,175 | A | 7/1961 | Borst | |
| 3,006,777 | A | 10/1961 | Atkin | |
| 4,587,277 | A | 5/1986 | Sato | 523/136 |
| 4,938,233 | A * | 7/1990 | Orrison, Jr. | 128/849 |
| 4,938,967 | A * | 7/1990 | Newton et al. | 424/458 |
| 5,402,455 | A | 3/1995 | Angelo, II et al. | |
| 5,494,513 | A | 2/1996 | Fu et al. | |
| 5,645,518 | A * | 7/1997 | Wagh et al. | 588/318 |

(Continued)

FOREIGN PATENT DOCUMENTS

| | | |
|---|---|---|
| CA | 765765 | 8/1967 |
| CA | 773614 | 12/1967 |

(Continued)

OTHER PUBLICATIONS

Notice of Refusal dated Jan. 6, 2016, issued in corresponding Korean Application No. 10-2015-7019158, filed Dec. 6, 2006, 14 pages.
Notification of Undergoing Registration Procedures and Notification of Granting Patent Right dated Nov. 25, 2015, in corresponding Chinese Application No. 200680045960.3, filed Dec. 6, 2006, 6 pages.
Notice of Allowance issued in corresponding Japanese Application No. 2013-116194, filed Dec. 6, 2006, 3 pages.
Examination Report dated Jun. 16, 2015, issued in corresponding European Application No. 06851936.2, filed Dec. 6, 2006, 6 pages.
Notice of Reasons for Rejection dated May 7, 2015, issued in corresponding Japanese Application No. 2013-116194, filed Dec. 6, 2006, 8 pages.

(Continued)

*Primary Examiner* — Sean E Vincent
(74) *Attorney, Agent, or Firm* — Christensen O'Connor Johnson Kindness PLLC

(57) ABSTRACT

A composition of matter and method of forming a radiation shielding member at ambient temperatures in which the composition of matter includes a 'cold-fired' chemically bonded oxide-phosphate ceramic cement matrix; with one or more suitably prepared and distributed radiation shielding materials dispersed in the 'cold-fired' chemically bonded oxide-phosphate ceramic cement matrix.

14 Claims, No Drawings

(56) References Cited

U.S. PATENT DOCUMENTS

| | | | | |
|---|---|---|---|---|
| 5,819,186 | A | 10/1998 | Stephens | |
| 5,830,815 | A | 11/1998 | Wagh et al. | |
| 6,046,374 | A | 4/2000 | Stephens | |
| 6,133,498 | A * | 10/2000 | Singh et al. | 588/319 |
| 6,166,390 | A | 12/2000 | Quapp et al. | |
| 6,204,214 | B1 | 3/2001 | Singh et al. | 501/155 |
| 6,372,157 | B1 * | 4/2002 | Krill et al. | 252/478 |
| 6,518,212 | B1 * | 2/2003 | Wagh | C04B 28/34 501/111 |
| 6,565,647 | B1 * | 5/2003 | Day et al. | 106/813 |
| 7,250,119 | B2 | 7/2007 | Sayala | 252/478 |
| 7,476,889 | B2 | 1/2009 | DeMeo et al. | |
| 2002/0107133 | A1 * | 8/2002 | Troczynski et al. | 501/1 |
| 2002/0165082 | A1 * | 11/2002 | Singh et al. | 501/155 |
| 2003/0147485 | A1 * | 8/2003 | Wright et al. | 376/272 |
| 2005/0203229 | A1 | 9/2005 | Soundarajan | |
| 2005/0258405 | A1 * | 11/2005 | Sayala | G21F 1/00 252/582 |

FOREIGN PATENT DOCUMENTS

| | | | |
|---|---|---|---|
| CA | 2211145 | | 1/1996 |
| CA | 2260267 | | 1/1998 |
| CA | 2341206 | | 8/1999 |
| CN | 1214030 | | 4/1999 |
| JP | 52-85208 | | 7/1977 |
| JP | 52-92221 | | 8/1977 |
| JP | 59-183399 | A | 10/1984 |
| JP | 61-230095 | A | 10/1986 |
| JP | 2-223898 | A | 9/1990 |
| JP | 04-143697 | | 5/1992 |
| JP | 4-143697 | A | 5/1992 |
| JP | 8-62387 | A | 3/1996 |
| JP | 2520978 | * | 7/1996 |
| KR | 10-2004-0069154 | A | 8/2004 |
| RU | 94 005 540 | | 4/1996 |
| RU | 2 117 645 | | 8/1998 |
| RU | 2 156 509 | | 9/2000 |
| RU | 2 298 242 | | 4/2007 |
| RU | 2 372 309 | | 11/2009 |
| WO | 97/34848 | A1 | 9/1997 |
| WO | 04/001766 | | 12/2003 |
| WO | 2008/060292 | | 5/2008 |

OTHER PUBLICATIONS

Maspoch et al. {see Section 2.1.3 col. 1 p. 782; Chemical Society Reviews vol. 36 pp. 770-818 Web Feb. 8, 2007}.*

Sixth Sense (Oldham Sixth (C) 2005 [taken as Dec. 31] {http://sixthsense.osfc.ac.uk/chemistry/bonding/chemical.asp}).*

Otto Chemie (Product Webpage {http://www.ottokkemi.com/lab.chemicals/bismuthsalts.aspx } printed Jul. 7, 2012).*

Office Action for corresponding Japanese Application No. 2008-544509, mailed Oct. 18, 2011, 9 pages. (with English Translation).

* cited by examiner

CHEMICALLY BONDED CERAMIC RADIATION SHIELDING MATERIAL AND METHOD OF PREPARATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCES TO RELATED APPLICATIONS

This application is a continuation-in-part application of PCT application PCT/US2006/046722, filed Dec. 6, 2006, now abandoned, which is a continuation of U.S. patent application Ser. No. 11/441,833, filed May 26, 2006, now abandoned, which is a continuation-in-part application of U.S. patent application Ser. No. 11/295,708, filed Dec. 6, 2005, now abandoned.

BACKGROUND

1. Technical Field

The present invention relates to the field of chemically bonded oxide-phosphate ceramic and, more particularly, to chemically bonded oxide-phosphate ceramic having unique radiation shielding characteristics.

2. Description of the Related Art

Radiation containment, encapsulation, and shielding, including electromagnetic, and microwave shielding, is of increasing and considerable importance in a technologically advanced society. While nuclear power generation offers an alternative to fossil fuel energy sources, containment of waste materials currently raise the expense, thereby decreasing the overall economic feasibility of generating power. Other low level radioactive materials, such as medical wastes, industrial wastes, wastes from depleted uranium ordinance, and the like, also experience the same storage, shielding, and containment issues. Additionally, the proliferation of electronic devices has increased the need to provide effective electromagnetic-shielding. Electronic devices such as cellular telephones, microwave ovens, and the like may require electromagnetic energy shielding that blocks radiated energy from being directed towards the user.

The medical diagnostic field also makes extensive use of radioactive materials to aid in detection of human maladies. The utilization of x-rays and other forms of radioactive material to detect these problems has provided doctors with valuable insight into the patients medical condition. Drawbacks to these diagnostic methods include the shielding necessary to protect the patient and medical personnel from unwanted exposure to radiation and other forms of electromagnetic energy. Currently radioactive medical diagnostics make extensive use of lead as a shielding material. For example, a patient may wear a lead-lined vest to minimize exposure during an x-ray. Lead-lined drywall board is extensively used to provide shielding from primary and secondary x-radiation caused by the primary x-ray beam as well as scattering of the primary x-ray beam during medical x-rays. The x-ray machine itself may require significant shielding, such as provided by lead sheeting, to prevent undue human exposure to radioactive materials.

Metallic lead shielding is extensively utilized because it allows for efficient shielding without unduly consuming space. For example, a sheet of lead less than one inch thick may be implemented to shield an x-ray machine.

Lead shielding drawbacks include the mass of lead, the difficulty in forming structures for holding the lead sheeting in place, the desire for aesthetically pleasing structures, as well as the well-documented carcinogenic human health hazards in the exposure to and handling of lead, and the like. Existing lead-lined bonded gypsum wallboard is very labor intensive to properly install as a secondary and primary x-ray barriers in medical and dental x-ray rooms and facilities.

Other radiation shielding needs include the manufacture of non-lead wallboards that can effectively replace the existing industry standard lead-lined bonded gypsum wallboard used in medical and dental x-ray rooms and similar facilities worldwide. Space stations, satellites, and spacecraft are other areas of possible use for the present invention, as the forms of available radiation shielding materials such as aluminum foil and sheeting, lead dependent materials, and other proposed radiation shielding methods are known to either be minimally effective, require prohibitive thickness contributing to weight problems, sometimes toxic in nature, and often cumbersome relative to the need to develop versatile, strong, durable, relatively easily repaired, composite radiation shielding materials that provide uniquely reliable protective shielding in a space environment.

Utilization of cementious materials to contain and shield radioactive materials, which is described in U.S. Pat. No. 6,565,647, entitled: Cementitious Shotcrete Composition, which is hereby incorporated by reference in its entirety, may be problematic as Portland cement/concrete based systems implement weak hydrogen bonding (in comparison to ionic bonding and covalent bonding). Also these Portland cement based systems suffer from high levels of porosity (in comparison to other matrices, such as a polymeric based material and chemically bonded oxide-phosphate ceramics), corrosion and cracking issues.

Portland cement matrices also require extensive curing (twenty-one days) to ensure proper matrix formation. Other alternatives such as a polymeric based matrix may offer lower porosity but may degrade when exposed to organic solvents and either high or low pH materials. Portland cement matrices also are susceptible to corrosive attack from a variety of materials typically found in radioactive wastes.

Cold-fired ceramic cement materials, such as described in U.S. Pat. No. 5,830,815, entitled: Method of Waste Stabilization via Chemically Bonded Phosphate ceramics, U.S. Pat. No. 6,204,214, entitled: Pumpable/injectable phosphate-bonded ceramics, U.S. Pat. No. 6,518, 212, entitled: Chemically bonded phospho-silicate ceramics, and U.S. Pat. No. 6,787,495, entitled: Multi-purpose Refractory Material, all of which are hereby incorporated by reference in their entirety, do not disclose or suggest incorporating radiopac composite admixtures and therefore do not provide radiation shielding qualities. In an exemplary embodiment of the '815 patent, the following magnesium oxide-phosphoric acid reaction is shown as typical:

$$MgO+H_3PO_4+H_2O \rightarrow MgHPO_4.3H_2O$$

The '815 patent contemplates other metal oxides, including aluminum oxides, iron oxides, and calcium oxides, barium oxides, bismuth oxides, gadolinium oxides, zirconium oxides and tungsten oxides Minimizing the pH of the reaction, in comparison to a phosphoric acid (i.e., a more basic reaction) is achieved through utilization of a carbonate, bicarbonate, or hydroxide of a monovalent metal reacting with the phosphoric acid prior to reacting with the metal oxide or metal hydroxide. Other contemplated metals (M') being potassium, sodium, tungsten, and lithium. A partial exemplary reaction described in the '815 patent is:

$$H_3PO_4+M_2CO_3+M'Oxide \rightarrow M'HPO_4$$

Additionally the utilization of a dihydrogen phosphate to form the ceramic at higher pH (in comparison to the utilization of phosphoric acid) was also indicated in the following reaction:

$$MgO+LiH_2PO_4+nH_2O \rightarrow MgLiPO_{4.(n+1)}H_2O$$

Fired or low and high temperature curing ceramic materials as described in U.S. Patent Application Publication No. 20060066013 entitled: Low Temperature Process For Making Radiopac Materials Utilizing Industrial/Agricultural Waste As Raw Materials (such as over several hundred degrees Celsius) do not offer a viable alternative to cold-fired oxide-phosphate bonded ceramic structures. High curing temperatures may prevent the materials from being utilized in waste containment and shielding applications as high temperature firing (above several hundred degrees Celsius) requires the components be formed and fired in a remote location prior to transport and assembly in the desired location. High temperature cured ceramics may not be practical for forming large components due to the firing requirements. In-situ formation of fired ceramics for waste containment may be problematic because of the wastes being contained and the location of final storage. Ammonia may be liberated during the firing process. Inclusion of ammonia in the ceramic matrix may be detrimental to the resultant formation.

In U.S. Patent Application Publication 2002/0165082, entitled: Radiation Shielding Phosphate Bonded Ceramics Using Enriched Isotopic Boron Compounds, which is hereby incorporated by reference in its entirety, the utilization of enriched boron compound additives in a liquor solution for phosphate-bonded ceramics so as to provide radiation shielding is described. This document does not suggest radiation-shielding and encapsulation by combining 'cold-fired' chemically bonded oxide-phosphate cementitious materials with radiopac fillers and admixtures such as barium sulfate, barium oxide and compounds, gadolinium oxide and compounds, and cerium oxide and cerium compounds, tungsten oxides and compounds, and depleted uranium oxide and compounds.

U.S. Patent Application Publication 20050258405 entitled: Composite Materials and Technologies for Neutron and Gamma Radiation Shielding, which is hereby incorporated by reference in its entirety, describes the use of various radiopac composite material admixtures that are in some applications bonded by various modified Portland cements, grouting materials, epoxies, and magnesium oxychloride/phosphate cement. It is important to note while magnesium oxychloride/phosphate is a similar sounding and written description of a cementitious bonding technique, it is in fact a distinctly different cementitious bonding technique, and one that is known to produce a more porous and less advantageous result to the embodiments disclosed herein below regarding magnesium oxide-monopotassium phosphate cementitious bonding qualities. This published patent application neither includes nor recognizes the potential superior qualities and benefits of chemically bonded oxide-phosphate cementitious techniques for the creation of useful composite material radiation shielding.

BRIEF SUMMARY

Accordingly, the embodiments of the ceramic material and method disclosed and described herein provide 'cold-fired' chemically bonded oxide-phosphate ceramic cement or ceramic concrete composite materials with unique radiation shielding qualities and characteristics for the containment, encapsulation, and shielding of radioactive materials, electromagnetic, and microwave energy. In addition, the disclosed embodiments incorporate unique radiation shielding qualities for ceramic cement or ceramic concrete building materials and construction applications, including the coating of existing contaminated Portland cement and other cementitious and epoxy building and construction materials that are or may become contaminated with harmful radioactive and other harmful hazardous waste substances.

While a representative embodiment is described in the context of, but is not limited to, attenuating x-radiation generated by X-ray machines and devices in hospitals, medical and dental rooms and facilities, it can be incorporated into a number of products and permutations of products to accomplish the attenuation of X-rays, including, but not limited to, wallboard for medical and dental rooms, including vertical walls, flooring, and ceiling applications, removable and permanent shielding for medical transport carts, grout joint compound for sealing any leakage of x-radiation between two adjoining materials, and any other application where the attenuation and blocking of x-radiation and other contaminants is desired. While not experiencing the foregoing drawbacks of prior designs, oxide-phosphate ceramic cement structures form significantly lower porosity structures in comparison to Portland cement structures.

In an aspect of one embodiment, a composition of matter and method of forming a radiation shielding member at ambient temperatures in which the composition of matter includes a 'cold-fired' chemically bonded oxide-phosphate ceramic matrix, and a radiation shielding material dispersed in the 'cold-fired' chemically bonded oxide-phosphate ceramic matrix, is disclosed.

Low level radiation shielding in the present invention employs various combinations of effective radiopac fillers such as powdered barium oxide, barium sulfate, and other barium compounds, cerium oxide and cerium compounds, as well as powdered bismuth oxide and bismuth compounds, gadolinium oxide and gadolinium compounds, tungsten oxide and tungsten compounds , depleted uranium and depleted uranium compounds, which are bonded together in an acid-phosphate solution comprised of specific proportions of magnesium oxide (MgO) powder and potassium dihydrogen phosphate ($KH_2PO_4$) and water. The resultant composite chemically bonded oxide-phosphate ceramic materials have been shown to effectively block medical x-rays by providing the necessary radiation shielding needed to attenuate x-radiation up to 120 kVp at a material thickness up to 0.5 inches. Simply increasing the thickness of these chemically bonded oxide-phosphate ceramic composite radiation shielding materials effectively attenuates higher kVp energy levels.

In accordance with one embodiment, a composition of matter is provided that includes a chemically bonded oxide-phosphate based ceramic matrix and a radiation shielding material, wherein the radiation shielding material is dispersed in the chemically bonded oxide-phosphate based ceramic matrix, and the radiation shielding material is selected from the group consisting of barite, barium sulfate, cerium oxide, tungsten oxide, gadolinium oxide, annealed leaded glass 40% to 75% both powdered and fibers, zeolites, clinoptilotites, celestites and depleted uranium.

In accordance with another aspect of the invention, the zeolite is made up of the following components and the following approximate percentages by weight, 52.4% SiO2, 13.13% A1203, 8.94% Fe203, 6.81% CaO, 2.64% Na2O, 4.26% MgO, and MnO 10%.

In accordance with another aspect of the invention, barite by weight is approximately in the range of 89% to 99% $BaSO_4$ and in the range of 1% to 5.8% silicates, and wherein the range of percentages by weight of zeolite that will be present in the composition of matter of claim 2 is 0.2% to 50%.

In accordance with another aspect of the invention, the phosphate based ceramic matrix is selected from the group consisting of $KH_2PO_4$ (potassium dihydrogen phosphate), $MgHPO_4$ (magnesium hydrogen phosphate), $Fe_3(PO_4)_2$ (iron (II) phosphate), $Fe_3(PO_4)_2 8H_2O$(iron(II) phosphate octahydrate),$FePO_4$ (iron(III) phosphate), $FePO_4.2H_2O$ (iron(III) phosphate dihydrate), $AlPO_4$ aluminum phosphate, $AlPO_4.1.5H_2O$ (aluminum phosphate hydrate), $CaHPO_4$ (calcium hydrogen phosphate), $CaHPO_4.2H_2O$ (calcium hydrogen phosphate dihydrate), $BiPO_4$ (bismuth phosphate), $CePO_4$ (cerium(III) phosphate), $CePO_4.2H_2O$ (cerium(III) phosphate dihydrate), $GdPO_4.1H_2O$ (gadolinium phosphate), $BaHPO_4$(barium hydrogen phosphate), and $UPO_4$ (depleted uranium (U-238) phosphate).

It is to be understood that both the foregoing general description and the following detailed description are exemplary and explanatory only and are not restrictive of the embodiments as claimed.

DETAILED DESCRIPTION

Reference will now be made in detail to the presently preferred embodiments of the invention. The present invention is directed to a composition of matter and method for forming a radiation-shielding member at ambient conditions. Those of skill in the art will appreciate the composition of matter of the present invention is intended to be utilized for shielding and attenuation of various forms of radiation, including x-radiation, the electromagnetic and microwave spectrums; and energy from electron-beam welding (bremsstrahlung radiation or secondary radiation), and the like.

The composition of matter and method provides an efficient composition for utilization in constructing members that exhibit radiation-shielding capability in a region of the electromagnetic spectrum. The resultant material may be formed at ambient conditions in a rapid time frame (one-half hour curing to two days curing). This allows for the formation of a chemically bonded oxide-phosphate ceramic matrix with radiation, electromagnetic, and microwave shielding inclusion materials without the high temperature firing typically required. Typical high temperature firing may exceed several hundred degrees Celsius and usually may occur in the range about 1800° C. (one thousand eight hundred degrees Celsius). While the present method of 'cold-firing' (curing at ambient temperatures) may occur at or below 100° C. (one hundred degrees Celsius), the foregoing may allow for in-situ formation of a member such as a shielding structure or efficient transportation and installation of a preformed panel or structure formed of the composition of matter in comparison to other radiation shielding materials. For example, a structure formed in accordance with the present invention may allow for a fully cured wall partition to be formed and ready for use in the time frame of several days. A composition of matter of the present invention implements a 'cold-fired' chemically bonded oxide-phosphate ceramic material so as to form a matrix for including additional radiation shielding material therein. A chemically bonded oxide-phosphate ceramic matrix may be formed by the incorporation of a metal oxide with a phosphate containing substance or material. Those of skill in the art will appreciate that the resultant chemically bonded oxide-phosphate ceramic may be a hydrated form based on the constituent metal phosphate. Suitable metal oxides may include metal oxides in which the cationic component is associated with radiation shielding, such that the resultant metal phosphate ceramic may exhibit radiation-shielding capability. Suitable phosphates containing substances or materials include potassium dihydrogen phosphates, phosphoric acid, an acid phosphate, monohydrogen phosphates, and the like. Suitable oxides include magnesium, iron (II or III), aluminum, barium, bismuth, cerium (III or IV), gadolinium, tungsten, and depleted uranium (III) (substantially uranium 238).

The resultant chemically bonded oxide-phosphate ceramics may include $KH_2PO_4$ (potassium dihydrogen phosphate), $MgHPO_4.3H_2O$ (magnesium hydrogen phosphate trihydrate), $MgHPO_4$ (magnesium hydrogen phosphate),$Fe_3(PO_4)_2$ (iron(II) phosphate), $Fe_3(PO_4)_2.8H_2O$(iron(II) phosphate octahydrate), $FePO_4$ (iron(III) phosphate), $FePO_4.2H_2O$ (iron(III) phosphate dihydrate), $AlPO_4$ (aluminum phosphate), $AlPO_4.1.5\ H_2O$ (aluminum phosphate hydrate), $CaHPO_4$ (calcium hydrogen phosphate), $CaHPO_4.2H_2O$ (calcium hydrogen phosphate dihydrate), $BiPO_4$ (bismuth phosphate), $CePO_4$ (cerium(III) phosphate), $CePO_4.2H_2O$ (cerium(III) phosphate dihydrate), $BaHPO_4$ (barium hydrogen phosphate) and $UPO_4$(depleted uranium (U-238) phosphate). In further instances, different metal and rare earth phosphates/hydrogen phosphates such $GdPO_4 1H_2O$ gadolinium phosphate may be implemented as well. Suitable multiple metal phosphates may include magnesium hydrogen phosphate, iron(III) phosphate, aluminum phosphate, calcium hydrogen phosphate, cerium(III) phosphate, and barium hydrogen phosphate. In an embodiment the ceramic matrix is of the formula: ceramic matrix is of the formula: $MHPO_{4.xH2}O$ in which M is a divalent cation selected from the group consisting of: Mg (magnesium), Ca (calcium), Fe (iron(II)), and Ba (barium); wherein x is at least one of 0 (zero), 2 (two), 3 (three), or 8 (eight).

In a further example, the chemically bonded oxide-phosphate based ceramic matrix is of the formula: $MPO_{4.xH2}O$ in which M is a trivalent cation selected from: Al (aluminum), Ce (cerium (III)), $U^{238}$ (depleted uranium); and Fe (iron (III)); and x is at least one of 0 (zero), 1.5 (one point five), or 2 (two). In further embodiments, a multiple layer structure is formed to provide effective attenuation across a range of kilovolt-peak (kVp) ranges. For example, a multiple layer material is formed via a casting or spray application to form a mono structure exhibiting shielding and attenuation across a range. The layers may be formed of differing combinations of ceramics and shielding materials to achieve the desired shielding and attenuation. For example, a first layer is formed with a bismuth shielding material while a second layer is formed of a cerium based ceramic. A third layer of a ceramic including a barium sulfate shielding material may be included as well. In the present example, cerium oxide is included for its attenuation X-rays at 120 kVp at a material thickness of 0.5 inches. Greater material thickness will effectively attenuate x-radiation at higher levels of energy. Also, in one embodiment the bismuth can be prepared or applied in a manner that shields radiation below gamma rays on the electromagnetic spectrum in wavelength, frequency, or photon energy.

Thus, two or more radiation shielding materials can be employed to achieve a multiple layer structure. Because chemically bonded oxide-phosphate ceramic matrices successfully bond to themselves, use of two or more radiation shielding materials increases the range of shielding through layering of the materials in the ceramic matrix. Layering in one embodiment is accomplished through separate curing of individual layers, and then the layers are bonded together in a known manner, such as forming subsequent layers on previously cured layers or by bonding previously cured layers using a oxide-phosphate bonded ceramic adhesive.

In embodiments of the aforementioned layer process, suitable radiation shielding materials may be dispersed in the oxide-phosphate ceramic cement matrices. Those of skill in the art will appreciate that combinations of shielding materials may be incorporated into a single matrix to provide attenuation across a portion of the electromagnetic spectrum, such as X-rays, microwaves, and the like regions or portions of regions of the electromagnetic spectrum. Examples include powders, aggregates, fibers, woven fibers and the like. Exemplary materials include barite, barium sulfate, bismuth metal, tungsten metal, annealed leaded glass fibers and powders, cerium oxide, zeolite, clinoptilotite, plagioclase, pyroxene, olivine, celestite, gadolinium, suitable forms of lead, and depleted uranium.

A zeolite may be approximately by weight percentage 52.4% (fifty two point four percent) $SiO_2$ (silicon dioxide), 13.13% (thirteen point one three percent) $Al_2O_3$ (alumina oxide), 8.94% (eight point nine four percent) $Fe_2O_3$ (ferric oxide), 6.81% (six point eight one percent) CaO (calcium oxide), 2.64% (two point six four percent) $Na_2O$ (sodium oxide), 4.26% (four point two six percent) MgO (magnesium oxide). While barite may be approximately 89% (eighty nine percent) or above, $BaSO_4$ (barium sulfate) and 5.8% (five point eight percent) silicates with the remainder consisting of naturally varying percentages of titanium dioxide, calcium oxide, magnesium oxide, manganese oxide, and potassium oxide. The foregoing approximation is dependent on naturally occurring weight percentage variations. In one embodiment, the zeolite component of the ceramic is either a basalt zeolite or clinoptilolite of a particle size in the range of from about 5 microns to about 500 microns (minus 30 to plus 325 mesh −25% passing 325 mesh). Research carried out has shown the best results are obtained when zeolite is present in a weight range of about 2-20% by weight zeolite to ceramic. It has been found that with the combination of barite and zeolite, enhanced radiation protection is provided over what is provided by using barite alone, because of the isotope encapsulation abilities of zeolite.

The zeolite is preferably used in a natural form, although a synthetic zeolite can be used. As understood by those of skill in the art, the main zeolite formula is M2/nO.Al2O3.xSiO2.yH2O, with M defining the compensating cation with valence n [7]. The structural component is Mx/n[(AlO2)×(SiO2)y].zH2O, with the general structure as arrangements of tetrahedra in building units from ring structures to polyhedra.

In an exemplary embodiment, a method of constructing a shielding member includes mixing a metal oxide, such as a metal oxide including divalent metal cation with a phosphate containing material. Suitable phosphate containing materials include phosphoric acid, hydrogen phosphate substances (such as monohydrogen phosphates and potassium dihydrogen phosphates) and the like. A radiation shielding material may be incorporated into the metal oxide and phosphate containing material mix. Incorporating may include dispersing aggregate, powder, and fibers. Woven fibers may be incorporated as part of a casting process, a layering process, or the like. The incorporated radiation shielding material and metal oxide-phosphate ceramic may be cured to hardness (maximum compressive strength) at ambient conditions. For example, the member may be cast in place and the curing reaction being conducted at ambient conditions (i.e., ambient temperature). In an embodiment, the reaction and curing of the radiation shielding member occurs at, or at less than, 100° C. (one hundred degrees Celsius). Those of skill in the art will appreciate that the porosity of the resultant member may be varied based on the reagents selected. Excellent admixture aggregates so as to significantly decrease porosity and add strength are fly ash, bottom ash, and wollastinite that can be added in ratios ranging from 15:85 and 50:50, as well as other sparsely soluble silicates as explained in U.S. Pat. No. 6,518,212, entitled: Chemically bonded phospho-silicat ceramics: A chemically bonded phospho-silicate ceramic formed by chemically reacting a monovalent alkali metal phosphate (or ammonium hydrogen phosphate) and a sparsely soluble oxide, with a sparsely soluble silicate in an aqueous solution. The monovalent alkali metal phosphate (or ammonium hydrogen phosphate) and sparsely soluble oxide are both in powder form and combined in a stochiometric molar ratio range of (0.5-1.5):1 to form a binder powder. Similarly, the sparsely soluble silicate is also in powder form and mixed with the binder powder to form a mixture. Water is added to the mixture to form a slurry. The water comprises 50% by weight of the powder mixture in said slurry. The slurry is allowed to harden. The resulting chemically bonded phospho-silicate ceramic exhibits high flexural strength, high compression strength, low porosity and permeability to water, has a definable and bio-compatible chemical composition, and is readily and easily colored to almost any desired shade or hue. Other examples of these sparsely soluble silicates are Calcium silicate ($CaSiO_3$), Magnesium silicate ($MgSiO_3$), Barium silicate ($BaSiO_3$), Sodium silicate ($NaSiO_3$), Lithium silicate ($LaSiO_3$), and Serpentinite ($Mg_{64}.O_{10}.\{OH_8\}$).

In a specific embodiment, a radiation shielding member composed of a composition of matter of the present invention is constructed by mixing 1 lb. (one pound) of a metal oxide, monopotassium phosphate with 1 lb. (one pound) of radiation shielding material such as an aggregate, powder, or fiber filler attenuating material, and $H_2O$ (water) is added to approximately 20% (twenty percent) by weight, and the resultant 'cold-fired' composite radiation shielding material is allowed to cure. In this embodiment, the metal oxide-to-monopotassium phosphate ratio, by weight, is 1/3 (one-third) metal oxide, such as dead-burned magnesium oxide, to two thirds monopotassium phosphate, or MKP ($KH_2PO_4$) and a further weight ratio of 15:85 to 50:50 of fly ash, bottom ash and other suitable sparely soluble silicates. It should be noted that due to the differing molar ratios between the 'dead-burned' magnesium oxide (MgO) and the monopotassium phosphate (MKP), and/or any suitable alternate oxides and phosphate materials employed, the aforementioned MgO, MKP weight/volume ratios may be varied and still produce effective bonding for the intended attenuating/shielding admixtures.

In further embodiments, various carbonates, bicarbonate (such as sodium bicarbonate, potassium bicarbonate and the like) or metal hydroxides reagents may be reacted in a two step process with an acid phosphate to limit the maximum reaction temperature of the metal oxide and the result of the carbonate, bicarbonate or hydroxide reaction with an acid phosphate.

In further embodiments, other acids may be implemented to form a resultant metal oxide-phosphate ceramic-based material. The selection of the acid may be based on the metal oxide to be utilized; suitable metal oxides include divalent and trivalent metals (including transition metals and lanthanide series and actinide series metals). Other suitable acids include boric acid as a retardant (<1% of the total powder). And in another embodiment hydrochloric acid is used as a catalyst when certain oxide phosphate cementious blends such as a barium oxide, and bismuth phosphate blend are not suitably water-soluble.

In specific examples, mixing the selected ceramic matrix with the desired shielding material formed exemplary compositions. In one embodiment, the final combined mixture forms a product in which the shielding material is cemented or bonded with the ceramic matrix, which includes internal bonding or external bonding or both. In addition, the ceramic matrix materials are in the range of −200 mesh or below. The following specific examples are only exemplary and utilized to explain the principles of the present invention. The following procedures were conducted in ambient conditions (e.g., temperature, pressure). For instances, carried out at a room temperature of between 65° F. to 85° F. (sixty-five degrees Fahrenheit to eighty-five degrees Fahrenheit) under atmospheric pressure. No attempt was made to fully homogenize the material to obtain uniform particles, while substantially uniform distribution of shielding material within the ceramic matrix was attempted.

For samples in which woven fiber shielding fabric material is utilized, the ceramic is hydrolyzed and cast in contact with the fabric material. In instances in which powdered shielding material are incorporated, the particle size varied depending on the material. Ideally, the powder particles are sized in the range of −200 mesh or below. Those of skill in the art will appreciate that a wide range of particle sizes may be utilized. Water is added to hydrolyze the dry mixture. The combination of the water and ceramic oxide, phosphate and shielding material is mixed for a sufficient duration and with sufficient force to cause the mixture to exhibit an exothermic rise of between 20%-40% (twenty percent to forty percent) of the original temperature of the mixture. The hydrolyzed mixture was compacted via vacuum or vibratory or equivalent method to eliminate voids. Compaction is preferably conducted in a container, such as a polymeric container formed from polypropylene or polyethylene, having a low coefficient of friction to facilitate removal. The samples were allowed to harden to the touch (at least twenty-four hours) at ambient conditions.

The samples were submitted for x-ray lead equivalency testing. The samples submitted for testing were formed when a metal oxide such as MgO ('dead-burned' Magnesium Oxide), a suitable sparsely soluble silicate and radiopac additives as set forth in the present disclosure, are stirred in an acid-phosphate solution, (such as monopotassium phosphate and water). The dissolution of the metal oxide forms cations that react with the phosphate anions to form a phosphate gel. This gel subsequently crystallizes and hardens into a cold-fired ceramic. Dissolution of the oxide also raises the pH of the solution, with the cold-fired ceramic being formed at a near-neutral pH.

Controlling the solubility of the oxide in the acid-phosphate solution produces the chemically bonded oxide-phosphate ceramic. Oxides or oxide minerals of low solubility are the best candidates to form chemically bonded phosphate ceramics because their solubility can be controlled. The metal oxide in the sample formulations is known as 'dead-burned' Magnesium Oxide (MgO), calcined at 1300° C. or above in order to lower the solubility in the acid-phosphate solution. Oxide powders can be pretreated for better reactions with the acids. One technique includes calcining the powders to a typical temperature of between approximately 1,200° C. and 1,500° C. and more typically 1,300° C. It has been found that the calcining process modifies the surface of oxide particles in a myriad of ways to facilitate ceramic formation. Calcining causes particles to stick together and also form crystals; this leads to the slower reaction rates that foster ceramic formation. Fast reactions tend to form undesired powdery precipitates. Such 'dead-burned' magnesium oxide can then be reacted at room temperature with any acid-phosphate solution, such as ammonium or potassium dihydrogen phosphate, to form a ceramic of the magnesium potassium phosphate. In the case of magnesium oxide-mono potassium phosphate, a mixture of MgO ('dead-burned' Magnesium Oxide), $KH_2PO_4$ (Monopotassium Phosphate), and a suitable sparsely soluble silicate can simply be added to water and mixed from 5 minutes to 25 minutes, depending on the batch size. Monopotassium Phosphate dissolves in the water first and forms the acid-phosphate solution in which the MgO dissolves. The resultant 'cold-fired', chemically-bonded oxide-phosphate ceramics are formed by stirring the powder mixture of oxides and radiopac additives, including any desired retardants such as boric acid as have been clearly described herein, into a water-activated acid-phosphate solution in which the 'dead-burned' magnesium oxide (MgO) dissolves and reacts with the monopotassium phosphate (MKP) and in some applications a suitable sparsely soluble silicate such as wollastinite, and sets into a 'cold-fired' ceramic cementious material.

TABLE 1

CERAMIC SAMPLE FORMULATION

| Sample | H20 (g) | ceramic (g) | shielding material (g) | particle size | density lbs/ft$^2$ |
|---|---|---|---|---|---|
| 1 | 112.0 | 198.0 | 462.0 barium sulphate | 10 μm (microns) | 152.0 |
| 2 | 112.0 | 220.0 | 220.0 barium sulphate<br>220.0 bismuth | 325 mesh (bismuth) | 197.0 |
| 3 | 112.0 | 198.0 | 462.0 bismuth | 325 mesh | 225.0 |
| 4 | 112.0 | 198.0 | 462.0 cerium III oxide | 5.24 μm (microns) | 175.0 |
| 5 | 112.0 | 264.0 | 264.0 barium sulphate<br>66.0 bismuth<br>66.0 cerium III oxide | 10 μm (microns)<br>325 mesh (bismuth)<br>5.24 μm (microns) | 74.0 |
| 6 | 112.0 | | basalt powder 462 | | 130.0 |

TABLE 2

CERAMIC SAMPLE ATTENUATION

| | Attenuation | | | |
|---|---|---|---|---|
| Sample Designation | 60 kVp | 80 kVp | 100 kVp | 120 kVp |
| 1 | 99.99% | 99.97% | 99.76% | 99.05% |
| 2 | 99.99% | 99.98% | 99.77% | 99.64% |
| 3 | 99.89% | 99.85% | 99.77% | 99.70% |
| 4 | 99.95% | 99.92% | 99.82% | 99.37% |
| 5 | 99.96% | 99.91% | 99.66% | 99.19% |
| 6 | 89.17% | 81.79% | 75.36% | 69.62% |
| 7 | 97.34% | 96.37% | 93.81% | 90.00% |
| 8 | 56.08% | 52.33% | 47.83% | 43.52% |
| Measured Half Value Layer (HVL) | 3.0 mmA1 | 4.0 mmA1 | 5.1 mmA1 | 6.2 mmA1 |

TABLE 3

CERAMIC SAMPLE LEAD EQUIVALENCY (MILLIMETERS PB)

| | Lead Equivalency (mm Pb) | | | |
|---|---|---|---|---|
| Sample Designation | 60 kVp | 80 kVp | 100 kVp | 120 kVp |
| 1 | 1.8* | 1.800 | 1.535 | 1.065 |
| 2 | 1.8* | 1.822 | 1.552 | 1.445 |
| 3 | 0.635 | 1.380 | 1.551 | 1.525 |
| 4 | 0.758 | 1.440 | 1.660 | 1.225 |
| 5 | 0.790 | 1.410 | 1.375 | 1.125 |
| 6 | 0.119 | 0.126 | 0.130 | 0.129 |
| 7 | 0.242 | 0.390 | 0.428 | 0.362 |
| 8 | 0.064 | 0.068 | 0.070 | 0.070 |
| Measured Half Value Layer (HVL) | 3.0 mmA1 | 4.0 mmA1 | 5.1 mmA1 | 6.2 mmA1 |

*Due to the high attenuation of this sample, lead equivalency cannot be accurately reported for a tube potential of 60 kVp. The lead equivalency will be no less than that of the next higher kVp setting. (Wherein kVp—kilovolt-peak; mmA1-)

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention, or without sacrificing all of its material advantages. The form herein before described being merely an explanatory embodiment thereof. An expected specific change is the eventual inclusion of nano-sized constituent material preparation so as to increase the available surfaces principle of bonding. Most if not all of the chemically bonded oxide-phosphate radiation shielding ceramics described in the present patent can be produced as cement, concrete, drywall material, coatings, and groutings, and can be poured, sprayed, troweled, and molded into a variety of forms and uses. Therefore it is the intention of the following claims to eventually encompass and include most, if not all, of these changes and potentials.

In addition, the embodiments disclosed herein can be applied to radiation contaminated objects and structures, to encapsulate the same and contain the contaminant within the object or structure, thus shielding and protecting objects external to the encapsulated object or structure.

What is claimed is:

1. A composition of matter comprising:

a chemically bonded oxide-phosphate based ceramic matrix; and a radiation shielding material, wherein the radiation shielding material is dispersed in the chemically bonded oxide-phosphate based ceramic matrix in an amount of [40%-75%] *50%-70%* by weight and the radiation shielding material is selected from the group consisting of barium oxide, barium sulfate, cerium oxide, tungsten, tungsten oxide, gadolinium, gadolinium oxide, depleted uranium oxide, wherein the oxide-phosphate based ceramic matrix is [MgHPO4·3H2O] $MgHPO_4 \cdot 3H_2O$ (magnesium hydrogen phosphate trihydrate), or wherein the oxide-phosphate ceramic matrix includes at least two different metal phosphates.

2. The composition of matter of claim 1 wherein the at least two different metal phosphates are selected from the group consisting of $KH_2PO_4$ (potassium dihydrogen phosphate), $MgHPO_4$ (magnesium hydrogen phosphate), $Fe_3(PO_4)_2$ (iron(II) phosphate), [$Fe_3(PO_4)_2.8H_2O$] $Fe_3(PO_4)_2 \cdot 8H_2O$ (iron(II) phosphate octahydrate), $FePO_4$ (iron (III) phosphate), [$FePO_4.2H_2O$] $FePO_4 \cdot 2H_2O$ (iron(III) phosphate dihydrate), $AlPO_4$ (aluminum phosphate), [$A1PO_4.1.5H_2O$] $AlPO_4 \cdot 1.5H_2O$ (aluminum phosphate hydrate), $CaHPO_4$(calcium hydrogen phosphate), [$CaHPO_4.2H_2O$] $CaHPO_4 \cdot 2H_2O$ (calcium hydrogen phosphate dihydrate), $BiPO_4$(bismuth phosphate), $CePO_4$ (cerium(III) phosphate), [$CePO_4.2H_2O$] $CePO_4 \cdot 2H_2O$ (cerium (III) phosphate dihydrate), [$GdPO_{4.H2}O$] $GdPO_4 \cdot H_2O$ (gadolinium phosphate hydrate), $BaHPO_4$ (barium hydrogen phosphate), and $UPO_4$ (depleted uranium (U-238) phosphate).

3. The composition of matter of claim 1 wherein the radiation shielding material is formed as at least one or more of the aggregates or powders dispersed in the oxide-phosphate ceramic.

4. The composition of matter of claim 1 wherein the at least two different metal phosphates are selected from the group consisting of magnesium hydrogen phosphate, iron (III) phosphate, aluminum phosphate, calcium hydrogen phosphate, bismuth phosphate, cerium(III) phosphate, gadolinium phosphate, and barium hydrogen phosphate.

5. The composition of claim 1, comprising at least two radiation-shielding materials to form a multiple layer structure, wherein the at least two radiation-shielding materials are in separate layers of the multiple layer structure.

6. A method of constructing chemically bonded oxide-phosphate based ceramic matrix radiation shielding at ambient temperature, comprising:

providing a mixture [of] *comprising:*

(a) magnesium oxide, or at least two [a] metal oxides selected from the group consisting *of* aluminum oxide, magnesium oxide, iron(III) oxide[;], iron(II) oxide and calcium oxide;

(b) a phosphate containing material;

(c) a radiation shielding material selected from the group consisting of barium oxide, barium sulfate, cerium oxide, tungsten oxide, tungsten, gadolinium oxide, gadolinium, depleted uranium oxide, *wherein the radiation shielding material is in an amount of 50%-70% by weight*; and (d) a sparsely soluble silicate selected from the group consisting of calcium silicate ($CaSiO_3$), magnesium silicate ($MgSiO_3$), barium silicate ($BaSiO_3$), sodium silicate ($NaSiO_3$), lithium silicate ($LaSiO_3$), and serpentinite [(Mg64.O10.{OH8})] ($Mg_{64} \cdot O_{10} \cdot \{OH_8\}$);

adding an activator to the mixture; and allowing the mixture of the radiation shielding material, metal oxide, phosphate containing material [in an amount of 40%-75% by weight] and the sparsely soluble silicate to cure at ambient temperature.

7. The method of constructing a radiation shielding member at temperature conditions of claim 6 wherein curing occurs at less than 100° C. (one hundred degrees Celsius).

8. The method of constructing a radiation-shielding member at ambient temperature of claim 6 wherein the phosphate containing material is phosphoric acid.

9. The method of claim 6 wherein the activator is water or an acid.

10. A *composition formed from a* mixture comprising:

magnesium oxide, or at least two metal oxides selected from the group consisting of magnesium oxide, iron (III) oxide[;], iron(II) oxide and calcium oxide;

a phosphate-containing material;

a radiation shielding material selected from the group consisting of[;] barium oxide, barium sulfate, cerium oxide, tungsten, tungsten oxide, gadolinium, gadolinium oxide, and depleted uranium oxide;

wherein the radiation shielding material is in an amount of [40%-75%] *50%-70%* by weight; and a sparsely soluble silicate selected from the group consisting of calcium silicate ($CaSiO_3$), magnesium silicate ($MgSiO_3$), barium silicate ($BaSiO_3$), sodium silicate ($NaSiO_3$), lithium silicate ($LaSiO_3$), and serpentinite [($Mg_{64}.O_{10}.\{OH_8\}$)] ($Mg_{64}\bullet O_{10}\bullet\{OH_8\}$);

wherein the [composition] *mixture* forms a chemically bonded oxide phosphate ceramic matrix upon activation.

11. The mixture of claim [9] *10* wherein the phosphate-containing material is potassium dihydrogen [phosphates] *phosphate*, phosphoric acid, or potassium monohydrogen phosphate.

12. The mixture of claim 9 wherein the metal oxide is magnesium oxide, and the phosphate-containing material is potassium dihydrogen phosphate;

and the radiation shielding material is barium sulfate.

13. The mixture of claim 9 wherein the metal oxide is magnesium oxide, and the phosphate-containing material is potassium dihydrogen phosphate;

and the radiation shielding material is depleted uranium oxide.

*14. A method of shielding radiation emitting from a radiation source, comprising obstructing the radiation using a composition according to claim 10.*

* * * * *